United States Patent
Ent et al.

(10) Patent No.: US 9,996,124 B2
(45) Date of Patent: Jun. 12, 2018

(54) MULTI-PROCESSOR COMPUTING SYSTEM

(71) Applicant: Lenovo (Singapore) Pte. Ltd., Singapore (SG)

(72) Inventors: Ali Kathryn Ent, Garner, NC (US); Shuang Li, Shenzhen (CN); Jianyang Chen, Shenzhen (CN)

(73) Assignee: Lenovo (Singapore) Pte. Ltd., Singapore (SG)

( * ) Notice: Subject to any disclaimer, the term of this patent is extended or adjusted under 35 U.S.C. 154(b) by 110 days.

(21) Appl. No.: 14/920,686

(22) Filed: Oct. 22, 2015

(65) Prior Publication Data

US 2017/0115704 A1    Apr. 27, 2017

(51) Int. Cl.
*G06F 1/18* (2006.01)
*H01R 12/72* (2011.01)
*H01R 12/70* (2011.01)
*H05K 7/14* (2006.01)

(52) U.S. Cl.
CPC ............. *G06F 1/185* (2013.01); *H01R 12/72* (2013.01); *H01R 12/7005* (2013.01); *H05K 7/1417* (2013.01)

(58) Field of Classification Search
CPC ............ H01R 13/6397; H01R 12/7005; H01R 12/72; H01R 12/71; H05K 5/0021; H05K 7/1401; H05K 7/1417; H05K 7/1409; G06F 1/186; G06F 1/185
USPC ............ 361/679.01, 679.02, 789.31, 679.32, 361/679.37–679.41, 759, 801, 802; 439/308, 327, 325, 371
See application file for complete search history.

(56) References Cited

U.S. PATENT DOCUMENTS

| | | | | |
|---|---|---|---|---|
| 5,914,854 A | * | 6/1999 | Holt | G06F 1/184 361/679.23 |
| 6,181,565 B1 | * | 1/2001 | Schmitt | G06F 1/184 211/41.17 |
| 6,824,413 B1 | * | 11/2004 | Shipe | H01R 12/7005 439/157 |
| 7,029,297 B1 | * | 4/2006 | Co | H01R 13/62988 439/152 |
| 7,029,307 B1 | * | 4/2006 | Ling | H01R 43/26 439/327 |

(Continued)

OTHER PUBLICATIONS

Matrox AGP, PCI, and PCIe Guide, http://www.matrox.com/graphics/en/press/guides/addin/, 2015 (4 pages).

(Continued)

*Primary Examiner* — Steven T Sawyer
*Assistant Examiner* — Sagar Shrestha
(74) *Attorney, Agent, or Firm* — Brian J. Pangrle

(57) ABSTRACT

A system can include a board that includes a chipset that includes a processor; an edge connector housing and card lock assembly mounted to the board where the edge connector housing and card lock assembly includes a tongue that includes an axle and a latch rotatable about the axle for orientation in a locked state and in an unlocked state; and a video card operatively coupled to the processor where the video card includes a graphics processor and an edge received by the edge connector housing and card lock assembly and where the video card includes a prong wherein, in the locked state, an extension of the latch is disposed between a surface of the prong and a surface of the tongue.

17 Claims, 12 Drawing Sheets

(56) References Cited

U.S. PATENT DOCUMENTS

| | | | | |
|---|---|---|---|---|
| 8,174,835 | B2* | 5/2012 | Kim | G06F 1/185 |
| | | | | 361/679.31 |
| 8,292,647 | B1* | 10/2012 | McGrath | H01R 12/7005 |
| | | | | 439/327 |
| 8,328,567 | B1* | 12/2012 | Yang | H01R 12/7005 |
| | | | | 439/157 |
| 2001/0051457 | A1* | 12/2001 | MacLaren | H01R 13/64 |
| | | | | 439/488 |
| 2004/0174687 | A1* | 9/2004 | Wang | G06F 1/184 |
| | | | | 361/801 |
| 2006/0037012 | A1* | 2/2006 | Zomaya | G06F 8/65 |
| | | | | 717/168 |
| 2007/0093097 | A1* | 4/2007 | Guan | H01R 13/6335 |
| | | | | 439/157 |
| 2007/0294454 | A1* | 12/2007 | Danilak | G06F 3/14 |
| | | | | 710/305 |
| 2008/0266053 | A1* | 10/2008 | Tracy | G08C 17/00 |
| | | | | 340/5.2 |
| 2009/0077293 | A1* | 3/2009 | Kerrigan | H05K 7/1409 |
| | | | | 710/301 |
| 2011/0068240 | A1* | 3/2011 | Yang | H05K 7/1404 |
| | | | | 248/221.11 |
| 2013/0084723 | A1* | 4/2013 | Shen | H01R 12/7029 |
| | | | | 439/159 |
| 2013/0288492 | A1* | 10/2013 | Hack | H05K 7/1408 |
| | | | | 439/70 |
| 2014/0099815 | A1* | 4/2014 | Foster, Sr. | H01R 12/7029 |
| | | | | 439/327 |
| 2015/0070366 | A1* | 3/2015 | Potpallewar | G06F 1/3265 |
| | | | | 345/520 |
| 2016/0149323 | A1* | 5/2016 | Figuerado | H01R 12/716 |
| | | | | 439/345 |
| 2016/0286678 | A1* | 9/2016 | Venugopal | G06F 13/4068 |

OTHER PUBLICATIONS

Burdruk, PCI Express Basics, 2007 (40 pages).
NVIDIA, NVIDIA Maximus System Builders' Guide, Sep. 2012 (26 pages).
NVIDIA, NVIDIA Grid K1 Graphics Board, Jan. 2013 (17 pages).
NVIDIA, NVIDIA QUARO K6000, 2013 (1 page).
Samtec, PCI Express Card Sockets, 2015 (1 page).
Intel, PCI Express 3.0 438-Pin Riser Card Edge Connector, Feb. 2014 (48 pages).
PNY, NVIDIA GeForce GTX 980 Ti by PNY, 2015 (1 page).
NVIDIA, Quadro Power Guidelines, Jul. 2015 (10 pages).
NVIDIA, Tesla M2090 Dual-Slot Computing Processor Module, Jun. 2011 (17 pages).
NVIDIA, Tesla GPU Accelerators, 2014 (3 pages).
NVIDIA, GEFORCE GTX 660 Ti, Installation Guide, 2012 (37 pages).

* cited by examiner

MULTI-PROCESSOR COMPUTING SYSTEM

TECHNICAL FIELD

Subject matter disclosed herein generally relates to multi-processor computing systems.

BACKGROUND

A multi-processor computing system can include a processor mounted to a board such as, for example, a motherboard and, for example, a processor mounted to a card that is received in a connector that is mounted to the board.

SUMMARY

A system can include a board that includes a chipset that includes a processor; an edge connector housing and card lock assembly mounted to the board where the edge connector housing and card lock assembly includes a tongue that includes an axle and a latch rotatable about the axle for orientation in a locked state and in an unlocked state; and a video card operatively coupled to the processor where the video card includes a graphics processor and an edge received by the edge connector housing and card lock assembly and where the video card includes a prong wherein, in the locked state, an extension of the latch is disposed between a surface of the prong and a surface of the tongue. Various other methods, apparatuses, systems, etc., are also disclosed.

BRIEF DESCRIPTION OF THE DRAWINGS

Features and advantages of the described implementations can be more readily understood by reference to the following description taken in conjunction with examples of the accompanying drawings.

DETAILED DESCRIPTION

The following description includes the best mode presently contemplated for practicing the described implementations. This description is not to be taken in a limiting sense, but rather is made merely for the purpose of describing general principles of various implementations. The scope of invention should be ascertained with reference to issued claims.

Figure 1:
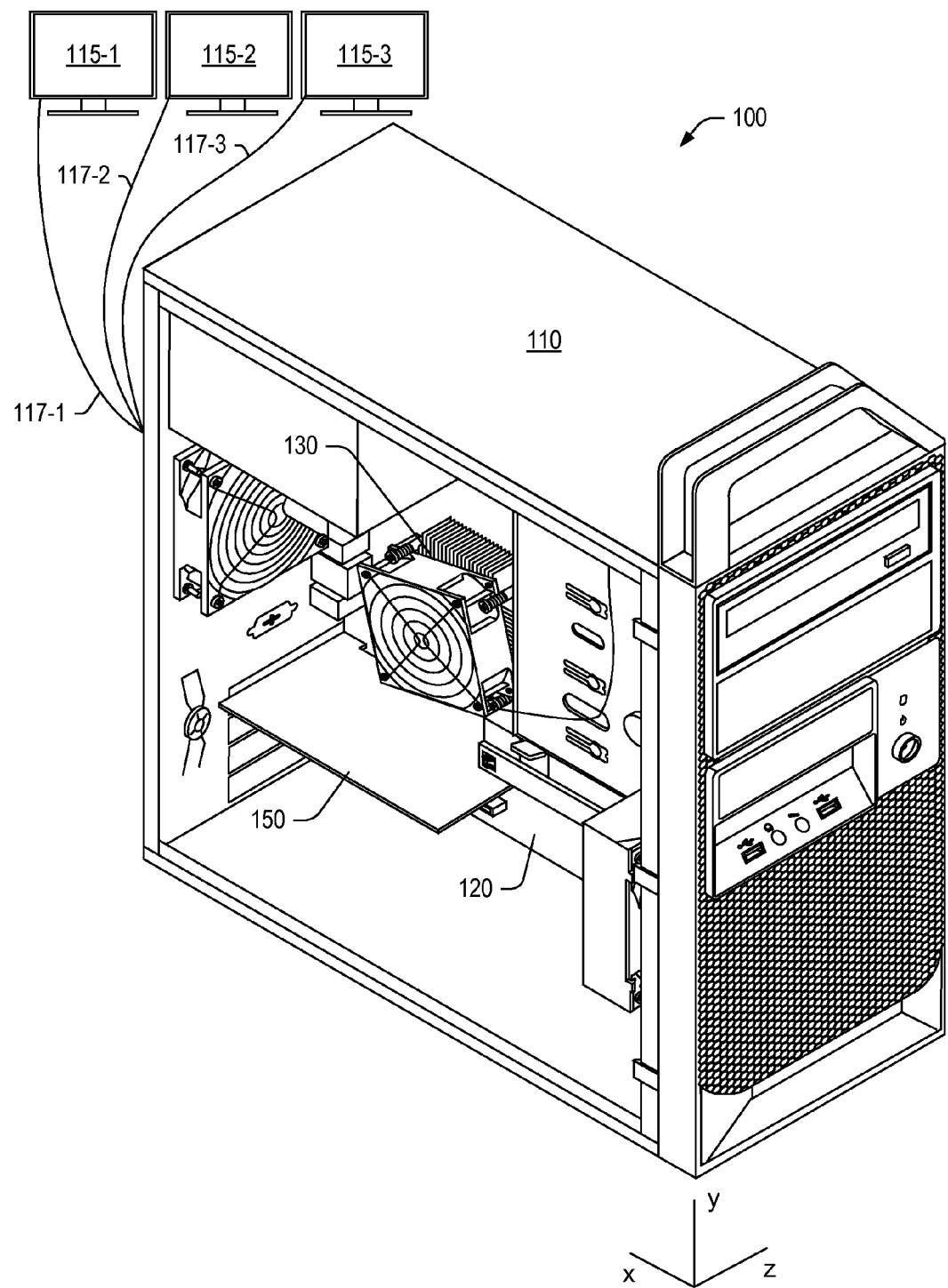
FIG. 1 is a diagram of an example of a computing system.

FIG. 1 shows an example of a computing system 100 that includes a case 110, a board 120, a processor 130 and a card 150. As shown, the board 120 is operatively coupled to the case 110 and the processor 130 is operatively coupled to the board 120. As an example, the card 150 can include circuitry such as, for example, one or more processing cores (e.g., a multi-core processor). Circuitry of the card 150 can be operatively coupled to the processor 130. For example, the processor 130 may instruct or otherwise control circuitry of the card 150. As an example, the processor 130 can include a chipset or, for example, a separate chipset may be included in the computing system 100.

As an example, the computing system 100 can be a workstation computing system. As an example, the computing system 100 can include one or more displays 115-1, 115-2 and 115-3. As an example, the board 150 can be a video card. In such an example, the card 150 may include circuitry that can provide signals to one or more of the displays 115-1, 115-2 and 115-3. As an example, the card 150 can include connectors for cables 117-1, 117-2 and 117-3 that connect the displays 115-1, 115-2 and 115-3.

Figure 2:
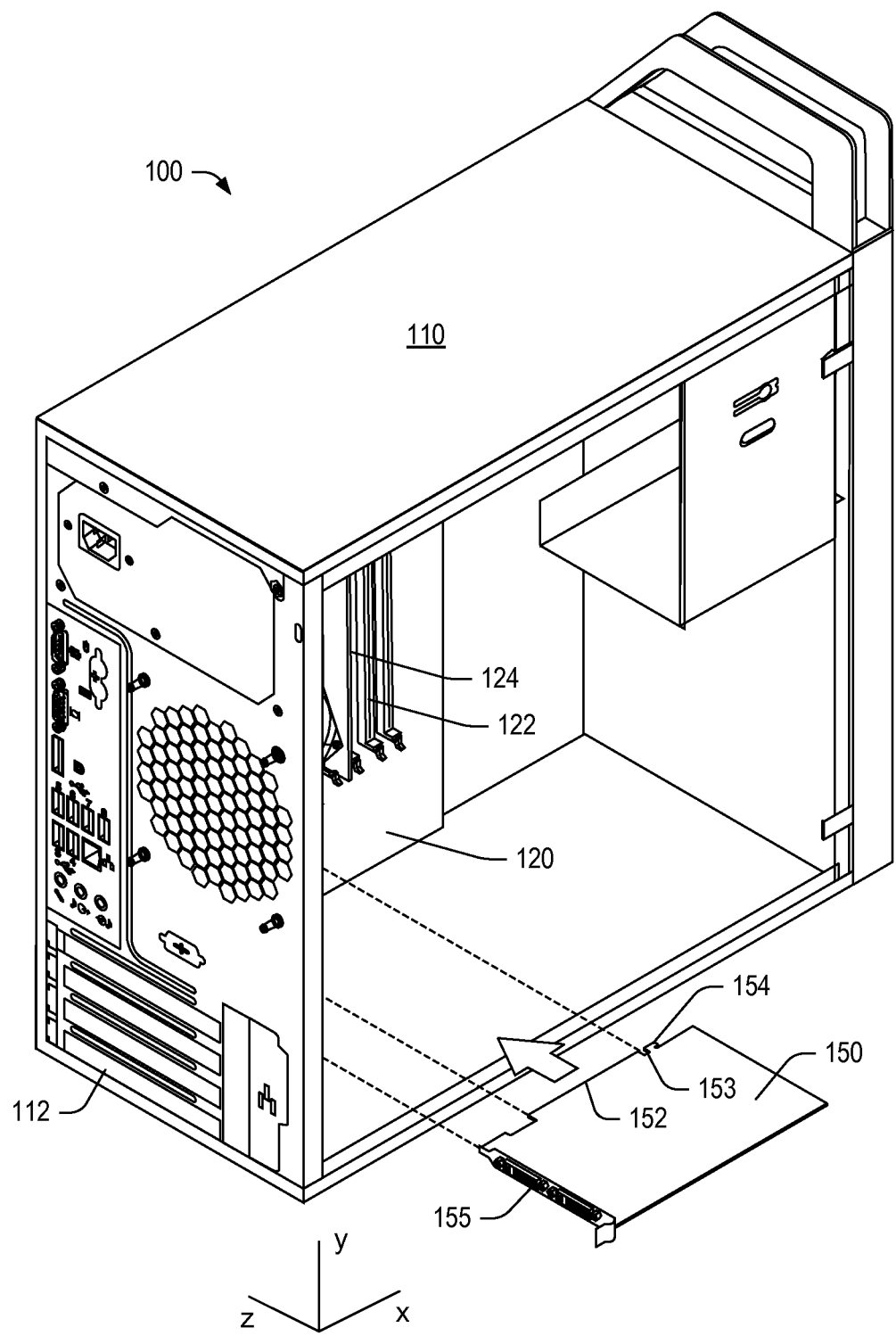
FIG. 2 is a diagram of the computing system of FIG. 1.

FIG. 2 shows the computing system 100 of FIG. 1 where the case 110 includes slots 112 and where the board 120 includes memory slots 122 that can receive memory 124. The processor 130 can be operatively coupled to the memory 124 as operatively coupled to one of the memory slots 122.

FIG. 2 also shows the card 150 as including an edge 152 and a prong 154 with a keyway disposed between a portion of the edge 152 and the prong 154. As shown the prong 154 can have a shape akin to a "hockey stick". The card 150 can also include one or more connectors 155. As an example, a connector 155 may be disposed in a slot or slots 112 of the case 110.

The card 150 can be received via an edge connector that can be mounted to the board 120. The edge connector can include electrical contacts that form electrical connections with electrical contacts at the edge 152 of the card 150.

An edge connector can include a socket formed by a housing where the socket can include electrical contacts such as, for example, pins on one or both sides of the socket. As an example, an edge connector may be keyed (e.g., keys, keyways, bumps, notches, etc.). As an example, an edge connector can include electrical contacts that can be operatively coupled to a board such as, for example, a motherboard, etc. As an example, an edge connector can include fittings, fixtures, etc. to facilitate locating the edge connector, for example, on a board.

As an example, an edge connector can be a PCI (Peripheral Component Interconnect) edge connector. The specifications for PCI are maintained by the PCI-SIG (PCI Special Interest Group). As an example, PCI Express is a type of PCI (e.g., "PCIe").

A connection between a PCIe device and other components of a system can be referred to as a link. A link may be specified, for example, via a bi-directional, serial (1-bit), point-to-point connection known as a lane. As an example, a link can use more than one lane at a time. As an example, an edge connector may be specified by lane, such as ×1 link, ×4 link, ×8 link, ×16 link, etc. As an example, a video card can be a PCIe device that can include a ×16 link edge that can be received by an edge connector (e.g., a ×16 link edge connector).

Various types of PCIe cards may physically fit into a respective type of edge connector with a corresponding lane configuration or higher (e.g., up-plugging). For example, a ×1 card may fit into ×1, ×4, ×8, and ×16 edge connectors. As an example, a link may be operatively coupled to a hub of a computing system that may perform, for example, network-like switching.

TABLE 1

PCI Card Pins and Length

| | Pins | | Length | |
|---|---|---|---|---|
| Lanes | Total | Variable | Total | Variable |
| ×1 | 2 × 18 = 36 | 2 × 7 = 14 | 25 mm | 7.65 mm |
| ×4 | 2 × 32 = 64 | 2 × 21 = 42 | 39 mm | 21.65 mm |
| ×8 | 2 × 49 = 98 | 2 × 38 = 76 | 56 mm | 38.65 mm |
| ×16 | 2 × 82 = 164 | 2 × 71 = 142 | 89 mm | 71.65 mm |

Figure 3:
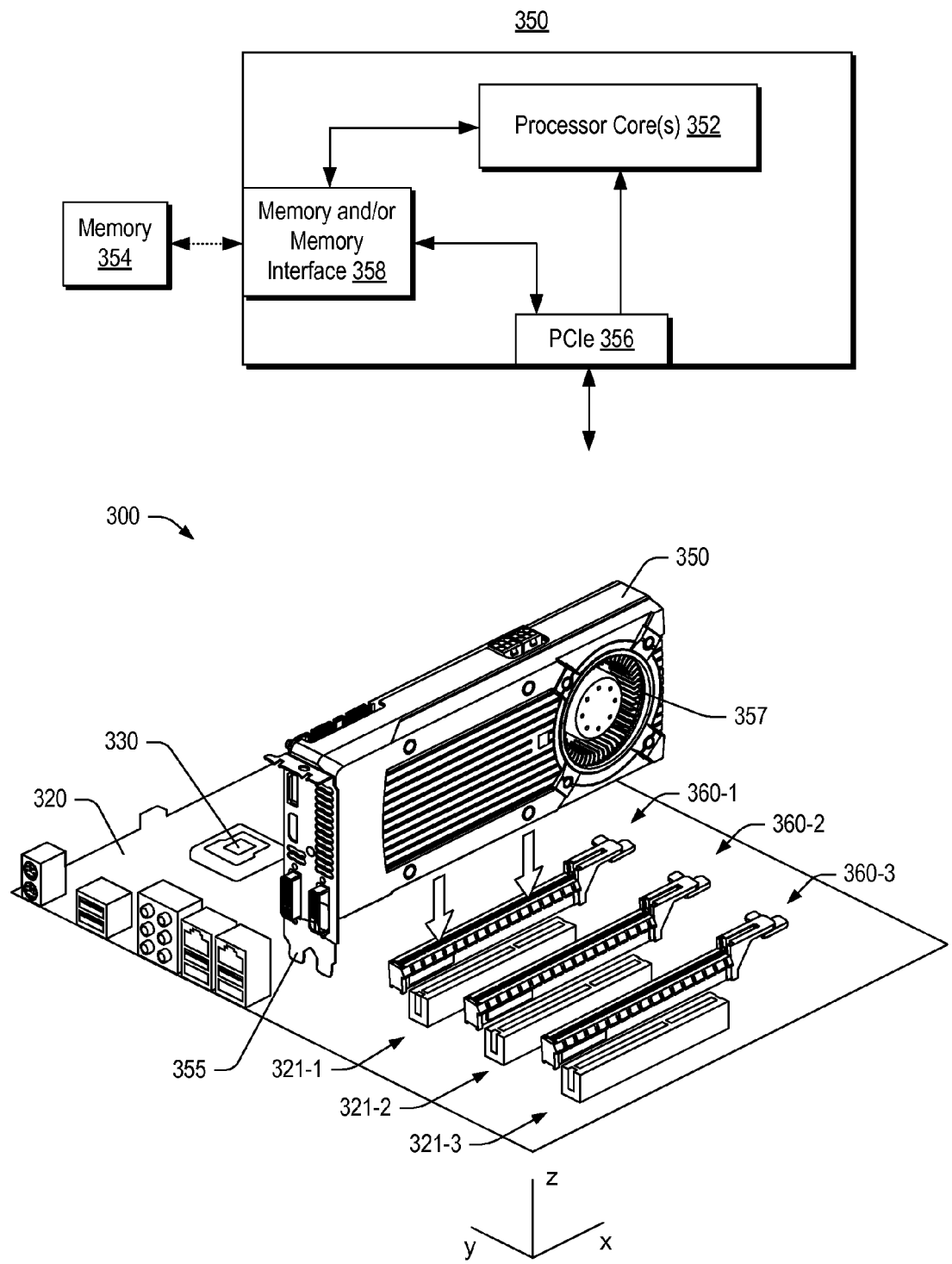
FIG. 3 is a diagram of an example of a computing system that includes a video card.

As an example, the width of a PCIe edge connector can be approximately 8.8 mm and, for example, the height can be approximately 11.25 mm. As to length, it can be suitable long to accommodate a card. As an example, a section of an edge connector can be approximately 11.65 mm in length and include two rows of about 11 pins (e.g., 22 pins total) while the length of another section can be variable depending on the number of lanes. As an example, pins can be spaced at approximately 1 mm intervals, and the thickness of an edge of a card to be received by a connector can be approximately 1.8 mm. As an example, a card can be defined by a width where the width may be, for example, greater than about 9 mm. As an example, a card can include a width greater than about 20 mm. As an example, a card can include a width greater than about 30 mm. As an example, a card can include a width of about 40 mm. As an example, a card may be defined to be a double wide card based, for example, on a number of slots occupied by a card. For example, FIG. 2 shows four slots 112 and a card 150 that includes one or more connectors 155 that may occupy a single one of the slots. FIG. 3 shows a card 350 as including a double-wide end, optionally with various connectors 355 and/or optionally with vents. As an example, the card 350 may be about 24 cm in length (e.g., about 9.5 inches) and about 11 cm in height (e.g., about 4.4 inches). As an example, the card 350 can include a width of about 4 cm (e.g., about 1.5 inches). As shown in FIG. 3, the card 350 can include a fan 357 (e.g., an air mover for management of heat energy). As an example, a card can include one or more heat transfer mechanisms (e.g., cooling conduits, fins, etc.).

As an example, the card 350 can be a video card with at least one graphics processor and/or, for example, a computing card with at least one graphics processor. For example, consider a card such as one of the TESLA™ computing module cards marketed by Nvidia, Santa Clara, Calif. For example, consider, as examples, one or more of the NVIDIA™ TESLA™ M2090, K40, K80 graphics processing unit (GPU) computing modules. Such computing module cards can be formed, for example, according to a double-wide form factor.

As an example, a computing card may include a double-wide end that can include vents, for example, for flow of air to cool components of the computing card. As an example, a video card that includes at least one graphics process can include a double-wide end that can include one or more connectors, for example, to connect the card to one or more displays, etc. As an example, a computing card may be considered to be a video card where the computing card includes at least one graphics processor (e.g., at least one GPU).

As an example, a computing system such as, for example, the computing system 100 of FIG. 1 and FIG. 2, can include a chipset, which may be integrated on a single "chip" with one or more processors or may be a separate "chip" or "chips". As an example, a chipset can be defined as a set of electronic components. For example, a chipset can be components in an integrated circuit (IC) that manage data flow between one or more processors and memory and, for example, one or more other circuits, circuitry, etc.

As an example, an integrated memory controller may be incorporated into a processor itself thus allowing the processor to directly access and handle memory. As an example, a processor can include an integrated PCIe controller and, for example, integrated graphics. In such an example, one or more video cards may be operatively coupled to the processor and, for example, controlled by an integrated PCIe controller or another controller. As an example, a chipset can include circuitry that performs so-called northbridge and southbridge functions into a single chip. For example, consider a platform controller hub (PCH) that includes circuitry for one or more of memory control, expansion bus (e.g., PCIe) interface (e.g., also consider a chipset that can include secondary PCIe connections), etc. Such a PCH can be part of a chipset that is part of a processor chip.

As an example, a chipset can be operatively coupled to a board such as, for example, a motherboard. As an example, a board such as, for example, a motherboard, can include one or more edge connectors. In such an example, the one or more edge connectors can include one or more PCIe edge connectors.

FIG. 3 shows an example of a computing system 300 that includes a board 320, a processor 330, the card 350 and various edge connectors 321-1, 321-2, 321-3, 360-1, 360-2, and 360-3. In the example computing system 300, the processor 330 can include a chipset or, for example, a separate chipset or chipsets may be included in the computing system 300.

As shown in the example of FIG. 3, the card 350 includes one or more processing cores 352, memory 354 (e.g., on-card and/or off-card), a PCIe edge 356, memory and/or a memory interface 358 where the various components are operatively coupled. As shown, the card 350 can be a video card that is wider than a so-called single-wide card. As an example, the card 350 may be referred to as a double-wide card as it includes an end that can occupy two slots of a computing system such as, for example, two slots 112 of the computing system 100 of FIGS. 1 and 2. The card 350 can be of a width such that when received by the edge connector 360-1 it "covers" at least a portion of the edge connector 321-1.

As an example, the card 350 can be a video card such as a video card that includes multiple processing cores that may define a so-called graphics processor unit (GPU). As an example, the board 320 can include PCIe compliant circuitry. As an example, the board 320 can include at least one dual-width ×16 graphics slot, for example, suitable for a 2-way/3-way scalable link interface (SLI) configuration. As an example, the computing system 300 can include a power supply. As an example, such a power supply may be rated at a minimum of about 100 W or more and may include one or more PCIe supplementary power connectors (e.g., to supply supplementary power to a video card, etc.).

A SLI provides support for multi-GPU technology for linking two or more video cards (e.g., optionally to produce a single output). SLI provides algorithms for parallel processing for computer graphics (e.g., to increase speed, etc.).

As an example, BIOS, SBIOS, etc., may be adjusted for a computing system, for example, where the physical location of a primary PCIe slot can be configured when there are more than one PCIe slots (e.g., ×16, etc.). As an example, where multiple cards are utilized, a bridge can be employed to connect the cards (e.g., consider a dual SLI bridge, a triple SLI bridge, etc.).

As an example, a card can include various types of connectors. For example, consider a HDMI (High-Definition Multimedia Interface) type connector that supports output of both video and audio; a DisplayPort type connector that supports single-lane transfer rates over a single cable; and one or more DVI type connectors (DVI-I and DVI-D) for connection to a digital display or, with an adapter to another type of display (e.g., VGA display using DVI-to-VGA adapter).

As an example, a video card can include a GPU engine that may, for example, include hundreds of cores and operate with memory such as memory with a Gbps rated memory clock.

Figure 4:
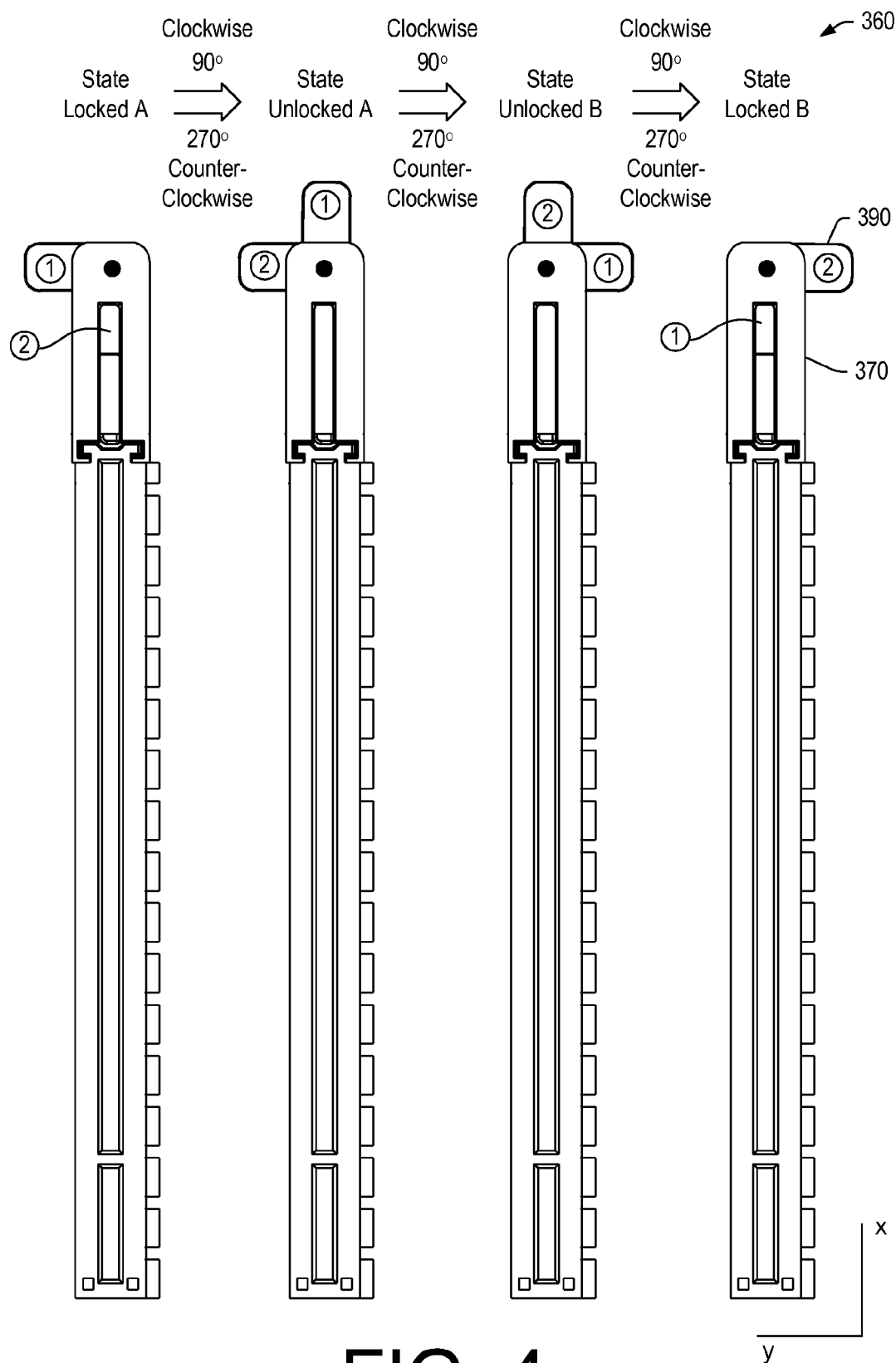
FIG. 4 is a diagram of an example of an edge connector and a plurality of states.

FIG. 4 shows an example of the edge connector 360 (e.g., 360-1, 360-2 or 360-3 of FIG. 3) in four states, including two unlocked states (A and B) and two locked states (A and B). Such states can be defined with respect to a prong of an edge of a card such as the prong 154 of the card 150 of FIGS. 1 and 2. The card 350 of FIG. 3 can include a prong such that the card 350 can be locked into one of the edge connectors 360-1, 360-2, or 360-3 of the system 300 of FIG. 3.

As an example, a state may be defined in part with respect to a latch 390, which may be a retention latch that acts to retain a card in the edge connector 360 (e.g., an edge connector assembly). For example, the edge connector 360 can include a lock portion 370 where a portion of the latch 390 may be rotatable to be disposed between a prong of a card and the lock portion 390. As an example, an edge connector can include features that can define states, for example, features that define positions of a latch with respect to a lock portion. Such features may act to orient a latch with respect to a lock portion of an edge connector.

As an example, the latch 390 of the edge connector 360 may be rotatable about an axis, as indicated by a filled circle on the lock portion 370 of the edge connector 360 of FIG. 4. As shown in the example of FIG. 4, the latch 390 includes an extension labeled 1 and an extension labeled 2.

In the example of FIG. 4, transition arrows indicate three examples of state transitions, including: a transition from Locked State A to Unlocked State A; a transition from Unlocked State A to Unlocked State B; and a transition from Unlocked State B to Locked State B. In these examples, the individual example transitions may be achieved via clockwise rotation of about 90 degrees or, for example, via counter-clockwise rotation of about 270 degrees. As an example, individual transitions may be made in a direction opposite the direction of the transition arrows. For example, consider a transition from Locked State B to Unlocked State B; a transition from Unlocked State B to Unlocked State A; and a transition from Unlocked State A to Locked State A. In such examples, the individual example transitions may be achieved via counter-clockwise rotation of about 90 degrees or, for example, via clockwise rotation of about 270 degrees. In the example of FIG. 4, the latch 390 may be rotated about 270 degrees clockwise to transition from Locked State A to Locked State B (e.g., via Unlocked State A and Unlocked State B). In the example of FIG. 4, the latch 390 may be rotated about 270 degrees counter-clockwise to transition from Locked State B to Locked State A (e.g., via Unlocked State B and Unlocked State A).

As an example, the latch 390 may be rotatable clockwise about 90 degrees to transition from Locked State B to Locked State A. As an example, the latch 390 may be rotatable counter-clockwise about 90 degrees to transition from Locked State A to Locked State B. In such examples, the latch 390 may be rotatable at least approximately 360 degrees (e.g., clockwise and/or counter-clockwise).

As an example, an edge connector can include a retention latch that can be used on the right hand or the left hand side of a PCIe connector located on a motherboard (e.g., of a PC, a workstation, etc.). In such an example, at least a portion of the latch can be visible where a double-wide card is received by the edge connector. In such an example, a user may visibly locate the latch and guide a finger to rotate the latch (e.g., as opposed to a blind operation where a latch is not visible from a viewpoint looking down on a board where a user may need to reach under the double-wide card to contact a latch).

As an example, an edge connector can provide various latch options. For example, consider a plurality of edge connectors where options of two sides or just one side may be utilized. In such an example, where components on a board may be near an edge connector, a choice may be available as to which side option to utilize.

As an example, a retention latch can include an L-shape, for example, where it may be rotated by hand so that one of the legs of the L-shape contacts a prong or is positioned over a prong of a video card and where the other leg is pointing out to the right or the left. To release a video card, an extension (e.g., a leg) may be rotated by pushing an exposed extension (e.g., leg) at least in part forward or backwards (e.g., such that one leg is out to the side and the other leg is forward). A reverse type of movement may allow for securing a video card.

Figure 5:
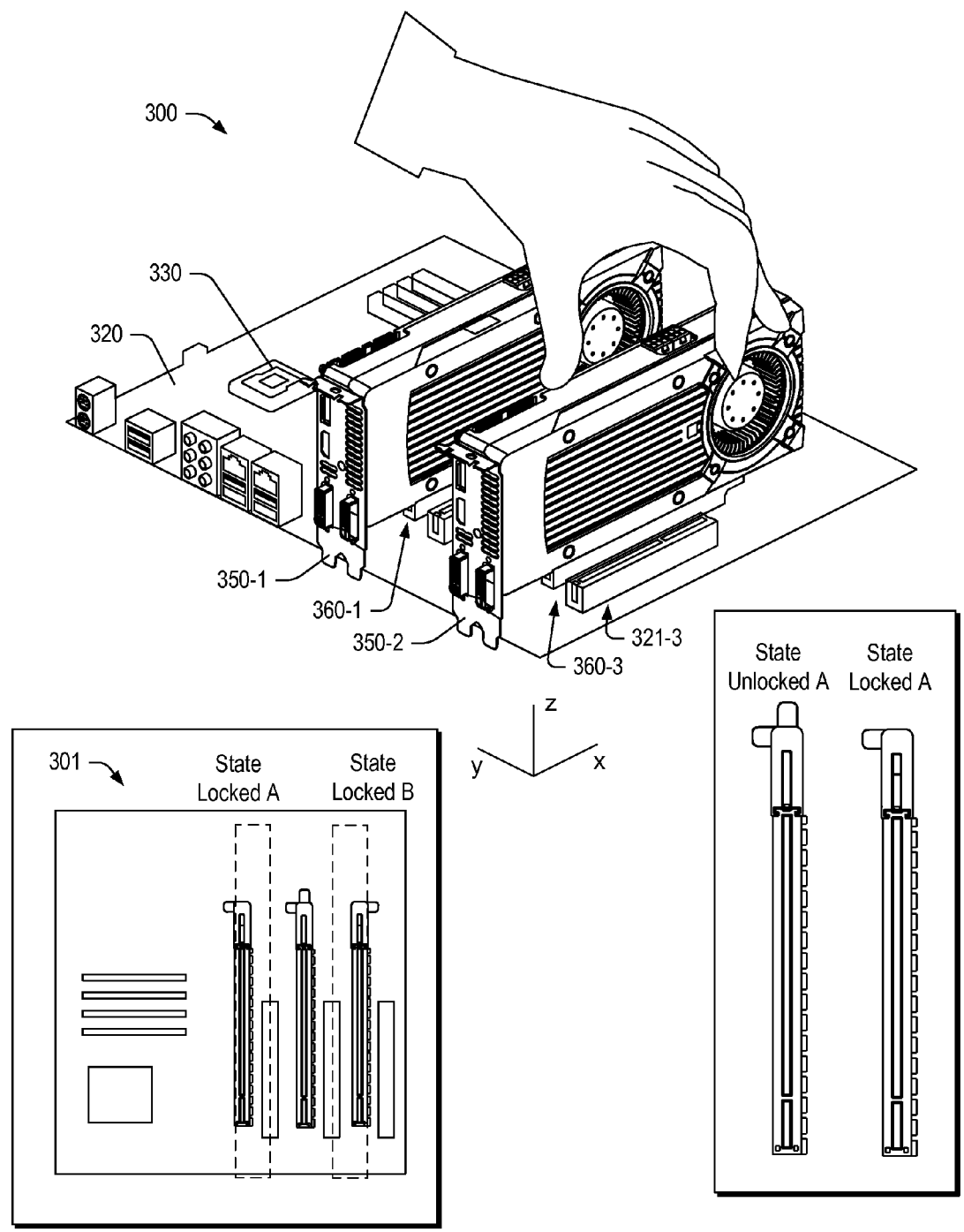
FIG. 5 is a diagram of examples of systems.

FIG. 5 shows the example system 300 of FIG. 3 where another card 350-2 is received by the edge connector 360-3. In the example system 300, the edge connector 360-3 can receive the card 350-2 in the unlocked state A and then secure the card 350-2 with respect to the edge connector 360-3 by being transitioned and set to the locked state A, which can facilitate unlocking of the card 350-2, for example, for removal of the card 350-2 from the edge connector 360-3. As an example, the edge connector 360-1 can be in the locked state A.

FIG. 5 also shows an example system 301 that includes various components of the system 300 where a plurality of edge connectors (e.g., edge connector housing and card lock assemblies) are mounted to a board and disposed in various states that may be associated with one or more cards, represented by dashed lines. A point of view from above, looking down at the system 301, includes lines of sight as to the latches of the edge connectors. As an example, a finger or tool may be brought into contact with a latch to rotate the latch about an axle to transition the latch from one state to another state and thereby to set the state of an edge connector. As shown in the top view of the system 301, a card can be of a width that is wider than a single edge connector such that it may render use of an adjacent edge connector impracticable; noting that an adjacent edge connector may be of a same or a different type.

As an example, a card can be received by an edge connector and locked into the edge connector where the edge connector locked state can be selected from a group of locked states. As an example, a locked state may be selected based at least in part on shape of a card. As an example, a locked state may be selected based at least in part on size of a card. As an example, a locked state may be selected based at least in part on shape and/or size of a card. As an example, as to shape and/or size, one or more of these factors may pertain to width of a card. As an example, as to shape and/or size, one or more of these factors may pertain to width of a card with respect to location of an edge (e.g., as to where the edge is disposed between sides of the card that define the width of the card).

Figure 6:
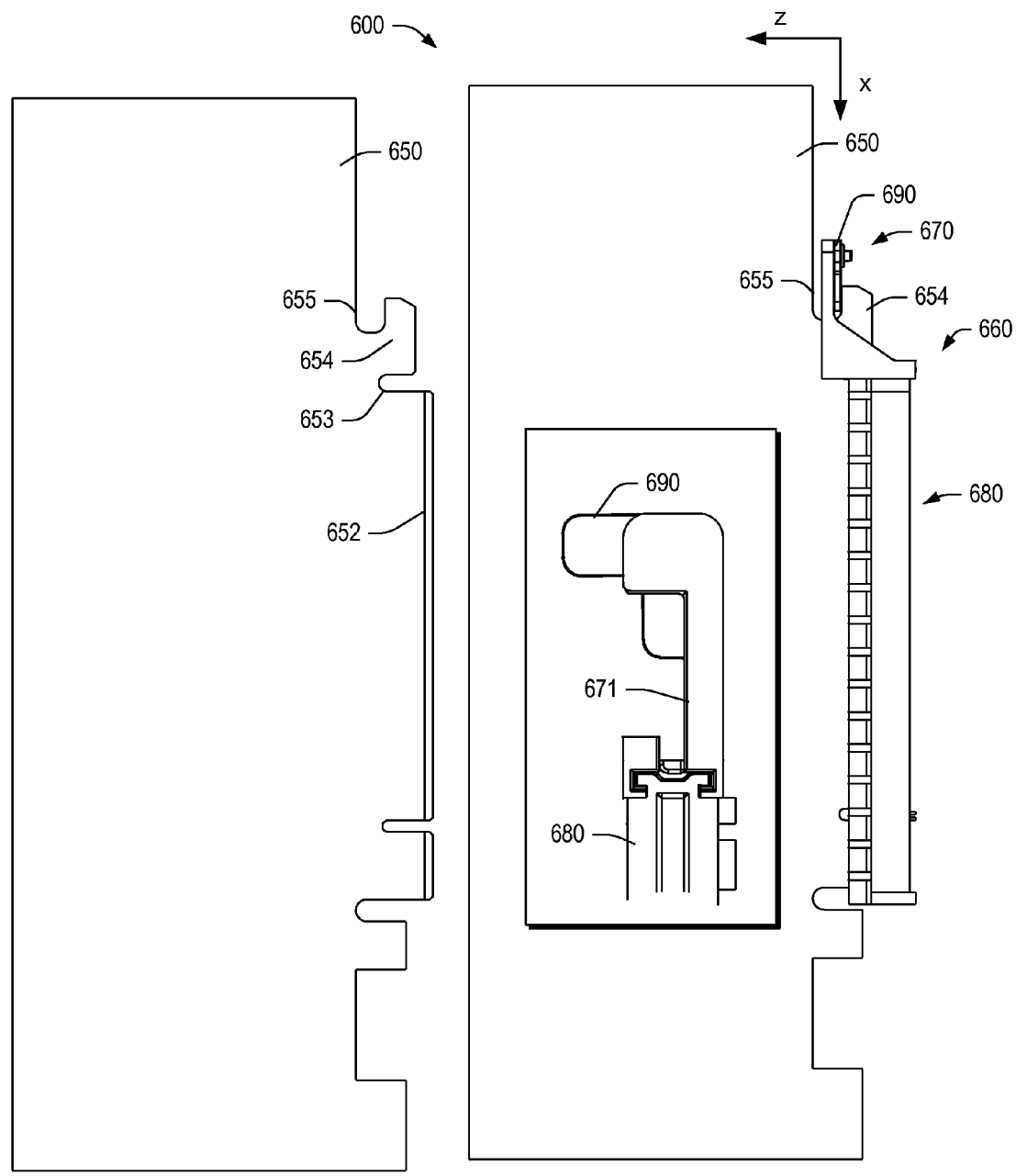
FIG. 6 is a series of diagrams of examples of a card and an edge connector.

FIG. 6 shows an example of a card 650 and an edge connector housing and card lock assembly 660. As shown, the card 650 includes an edge 652 and a prong 654 where a keyway 653 may be defined between a portion of the edge 652 and the prong 654, which may be considered a portion of the edge 652. As an example, the keyway 653 may be an axial keyway (z-coordinate direction) or heightwise keyway defined according to a standard, a type of edge connector, etc. As shown, the prong 654 may define a keyway 655, which is a lateral (x-coordinate direction) or lengthwise keyway. As shown in the example of FIG. 6, the keyway 653 and the keyway 655 are approximately orthogonal (e.g., one along the z-coordinate direction and the other along the x-coordinate direction).

As shown in FIG. 6, the edge connector housing and card lock assembly 660 includes a card lock portion 670 and an edge connector housing portion 680. As an example, the edge connector housing portion 680 may be integral with part of the card lock portion 670. As an example, the edge connector portion 680 and the card lock portion 680 may be attached to each other via a coupling or coupling (e.g., mating features).

As show in FIG. 6, the card lock 670 includes a latch 690. The latch 690 can define states such as the states shown in FIG. 4, which include two unlocked states and two locked states. As an example, one or more surfaces of the latch 690 may be color coded, which may be color coded with respect to one or more of the states.

In FIG. 6, the latch 690 is in a locked state as the latch 690 is disposed at least in part between a surface of the prong 654 and a surface of the card lock 670. In such an example, movement in the z-coordinate direction may be limited or restricted. As to the x-coordinate direction, movement may be limited or restricted by end portions of the edge 652 being seated in the edge connector housing 680.

In FIG. 6, a portion of the latch 690 is disposed at least in part in the keyway 655. FIG. 6 also shows an example of the latch 690 and an example of a card lock 671 where the card lock 671 does not define a slot with two substantially parallel walls. In such an example, a portion of the latch 690 can be disposed at least in part in a keyway of a card; noting that the edge connector housing 680 includes two substantially parallel walls that define a slot in which an edge of a card may be received.

Figure 7:
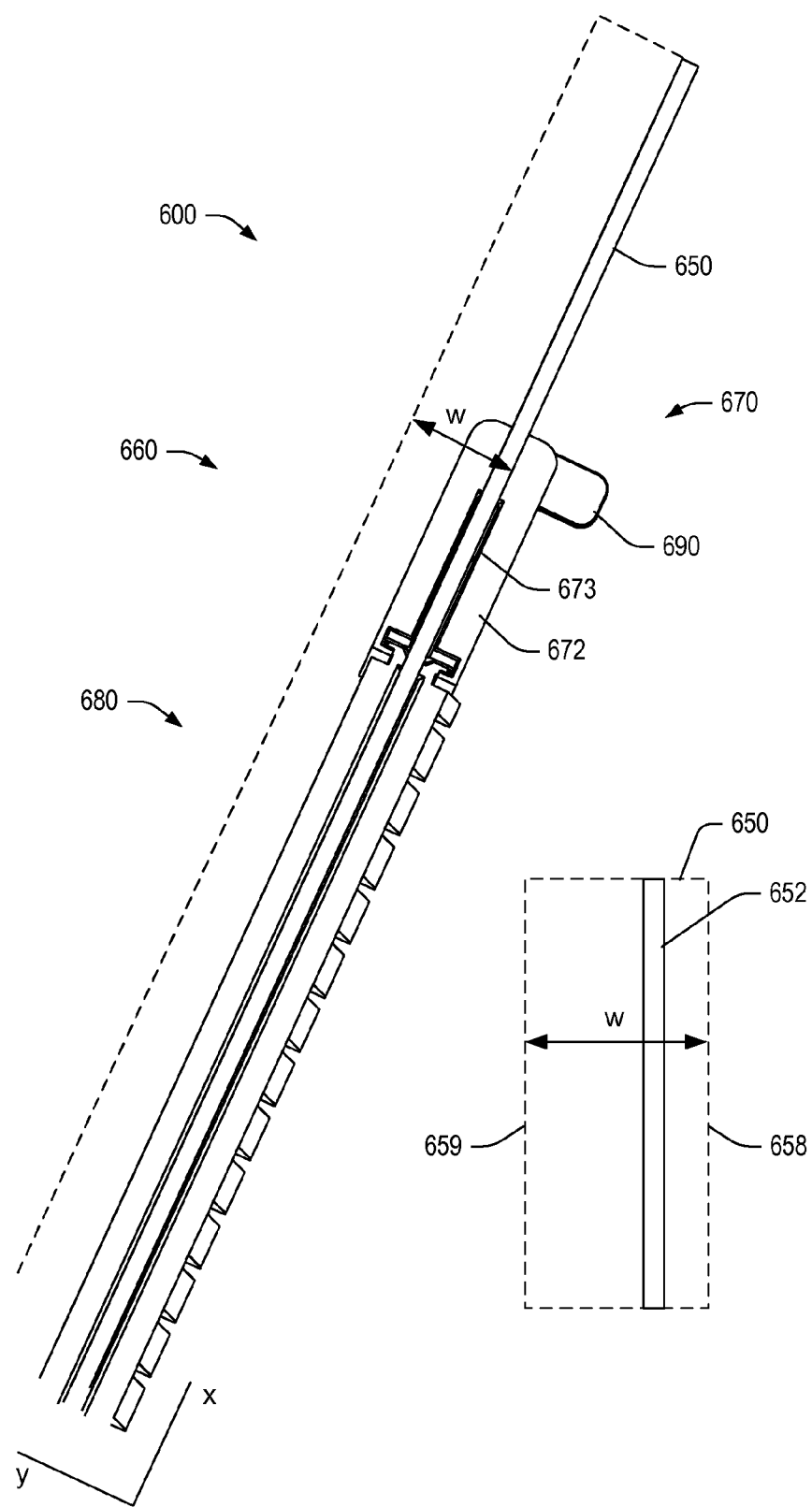
FIG. 7 is a diagram of an example of a card received by an edge connector.

FIG. 7 shows the system 600 as well as a dashed line that defines a card width between opposing sides 658 and 659 of the card 650. FIG. 7 also shows the edge connector housing 680 be coupled to the card lock 670 via a T-shaped end portion of the edge connector housing 680 being received in a T-shaped end socket portion of the card lock 670.

As shown in FIG. 7, the card lock 670 can be an assembly that includes the latch 690. As shown in the example of FIG. 7, the card lock 670 includes a tongue 672 that extends in the x-coordinate direction away from a slot defined by the edge connector housing 680. The tongue 672 may be an L-shaped tongue (see, e.g., the card lock 671 of FIG. 6) or a split tongue where either can support an axle about which the latch 690 is rotatable to transition from one state to another state. As an example, a state may be selected based in part on the width of the card 650 and, for example, where the edge 652 of the card 650 is located with respect to the width (w) as between the opposing sides 658 and 659.

Figure 8:
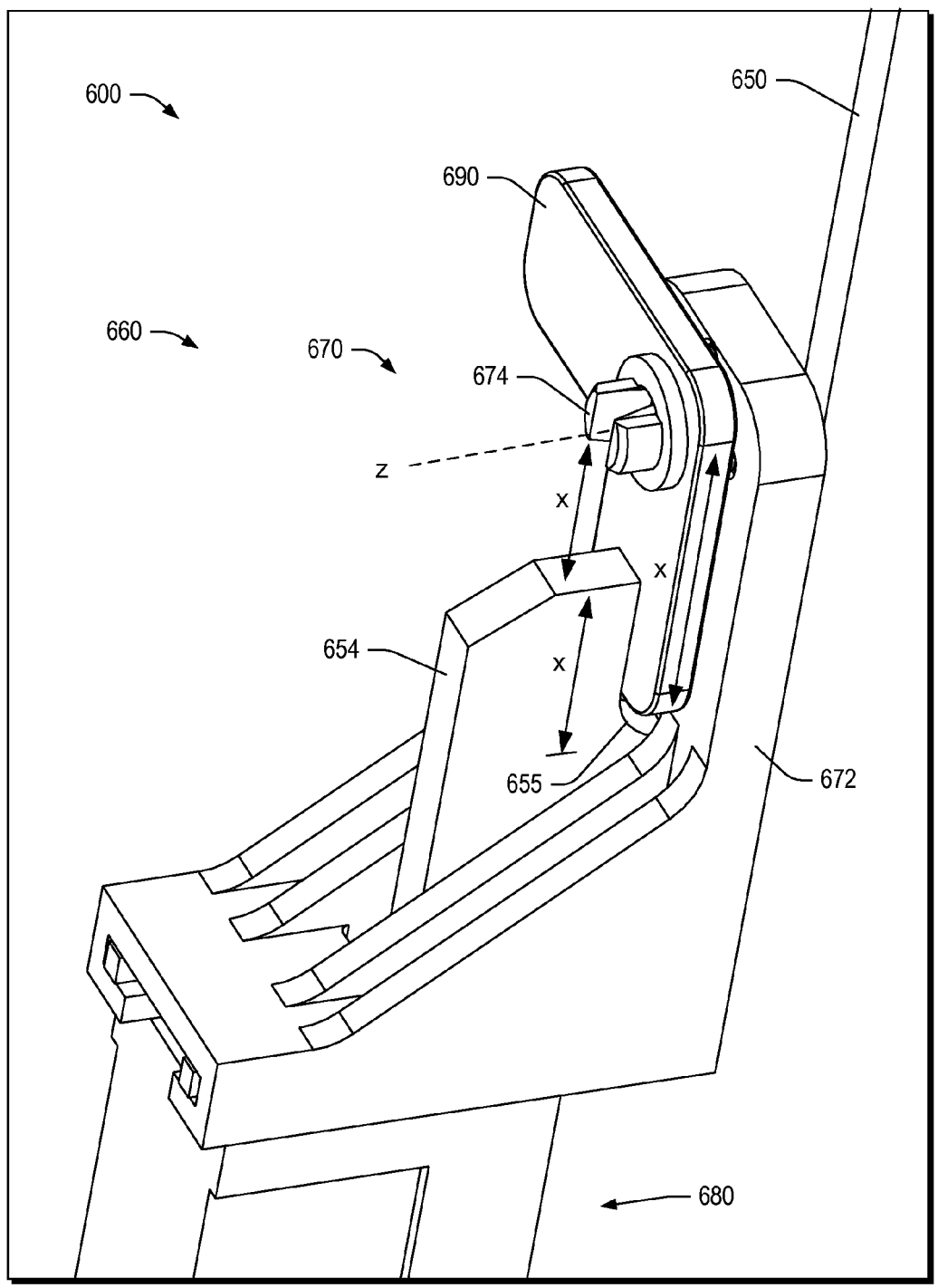
FIG. 8 is a diagram of an example of a portion of an assembly.

FIG. 8 shows a portion of the assembly 660 of FIG. 6 where the latch 690 is in a locked state with respect to the prong 654 of the card 650 (e.g., disposed at least in part in the keyway 655). As shown, the latch 690 is rotatable with respect to an axle 674 that is supported by the tongue 672. In the locked state, movement of the prong 654 in a direction of the z-coordinate is limited or restricted. As an example, the prong 654 may be in contact with the latch 690. As an example, the latch 690 may be in contact with the tongue 672. As an example, the prong 654 may contact the latch 690 and the latch may contact the tongue 672. As an example, if a clearance exists, the clearance may define an amount of movement of the card 650 in a direction of the z-coordinate.

Figure 9:
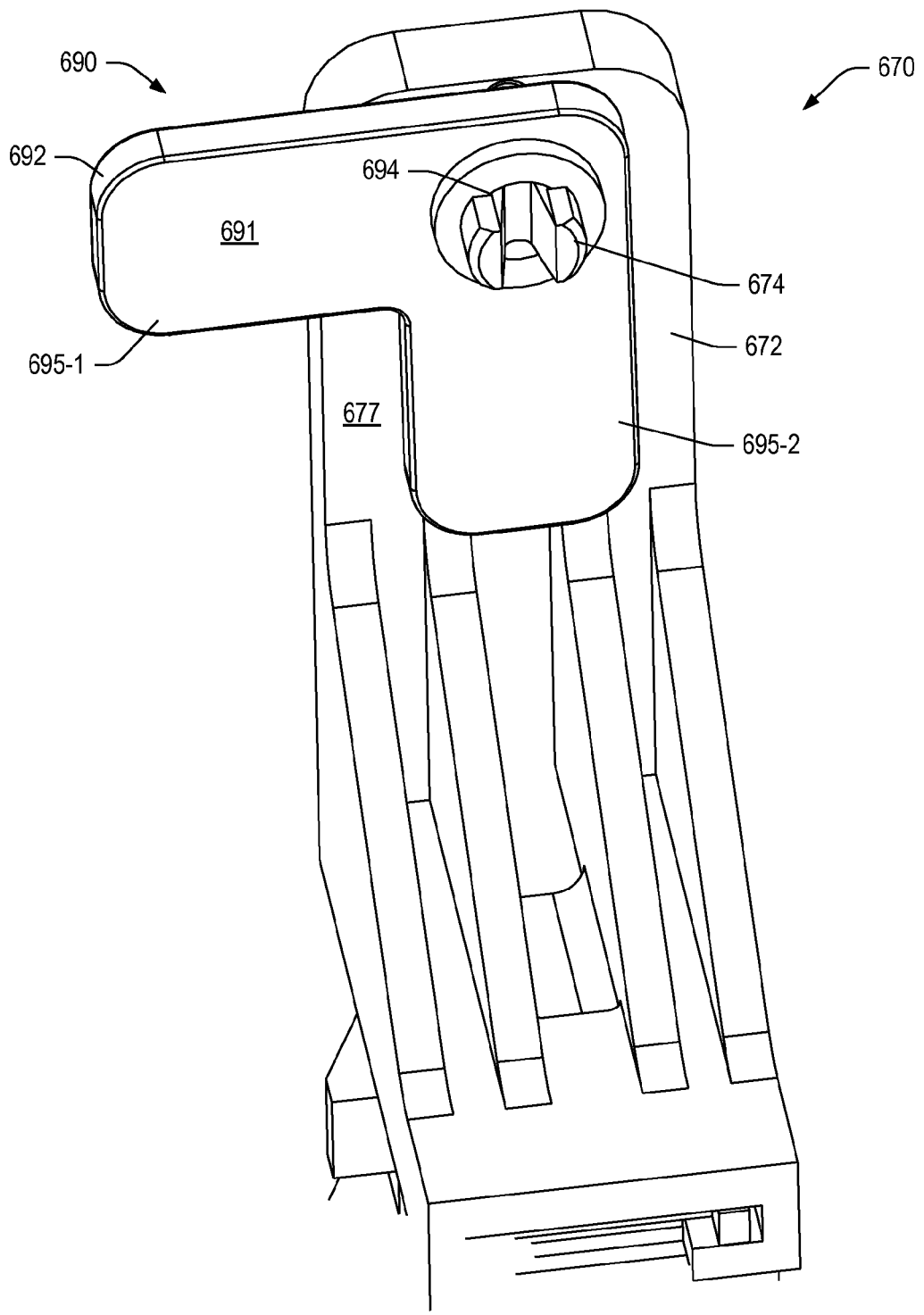
FIG. 9 is a diagram of an example of a portion of an assembly.

FIG. 9 shows a portion of the assembly 660 of FIG. 6 where the latch 690 is shown as including a surface 691, an edge 692, an opening 694, a first extension 695-1 and a second extension 695-2. As an example, the first and second extensions 695-1 and 695-2 can form an L-shape. As an example, the opening 694 can receive the axle 674 where the extensions 695-1 and 695-2 may be oriented at various angles about the axle 674, which extends at least in part in the z-coordinate direction. The orientations can correspond to states such as the states of FIG. 4 (e.g., two unlocked states and two locked states). As shown, the tongue 672 includes a lower surface 677 (e.g., a surface that faces a board and that can face a surface of the latch 690).

Figure 10:
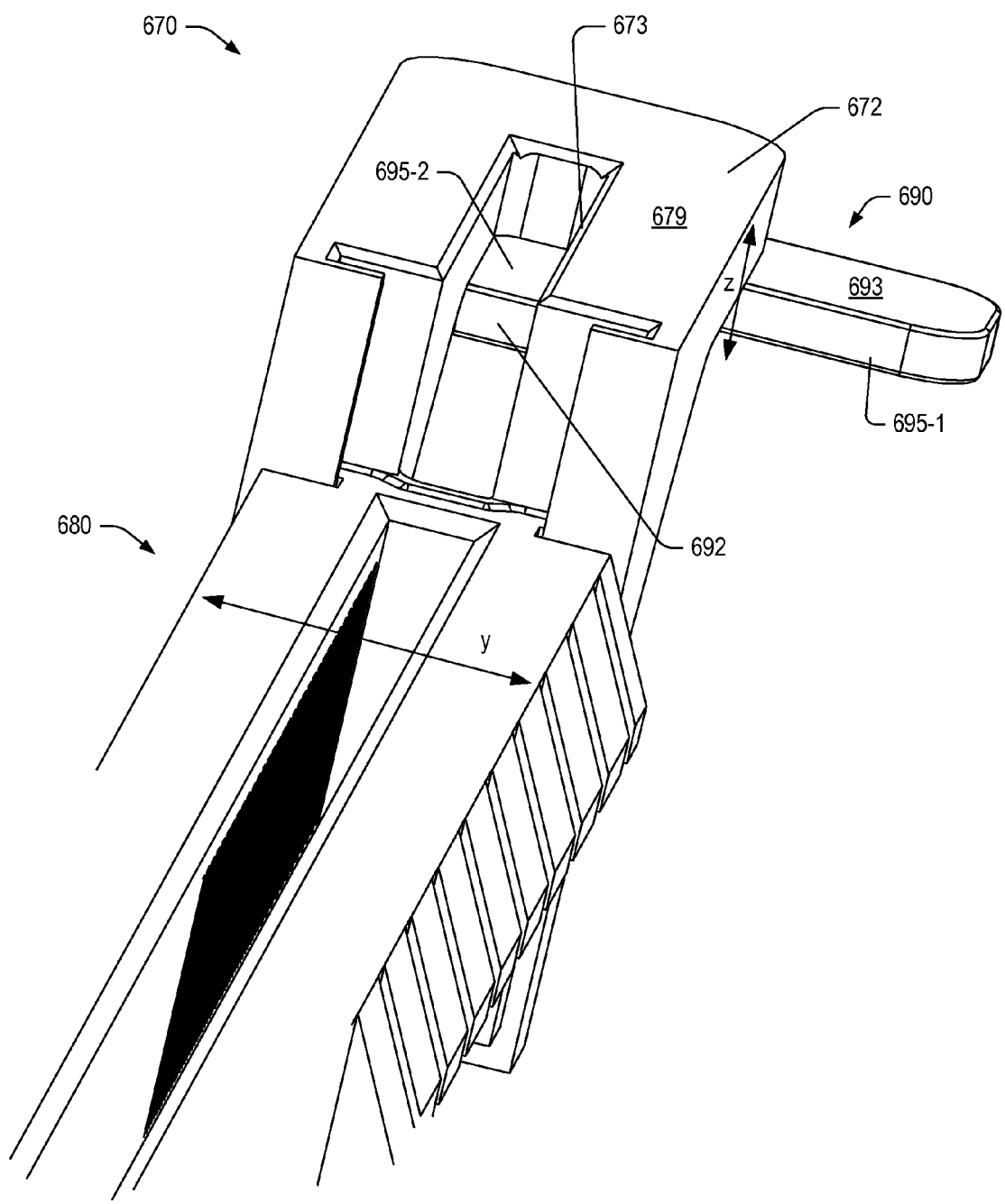
FIG. 10 is a diagram of an example of a portion of an assembly.

FIG. 10 shows a portion of the assembly 600 of FIG. 6 where the latch 690 includes a surface 693 that is an opposing surface to the surface 691, as separated therefrom via a dimension or dimensions (see, e.g., edge 692). As shown, the tongue 672 can include an upper surface 679, which is an opposing surface to the lower surface 677 of the tongue 672. In the example of FIG. 10, a portion of the edge 692 is shows via a slot 673 formed by the tongue 672 (e.g., a split tongue). In the example of FIG. 10, the edge connector housing 680 is shown as being received by a T-shaped socket of the card lock 670. As an example, along the x-coordinate direction, a dimension may define a key where, for example, one surface of the key is part of the edge connector housing 680 and another surface of the key is part of the card lock 670. Where a card includes a keyway that receives the key, the card may act to "lock" the edge connector housing 680 to the card lock 670, for example, where these are not integral (e.g., formed as a continuous piece of plastic, etc.).

Figure 11:
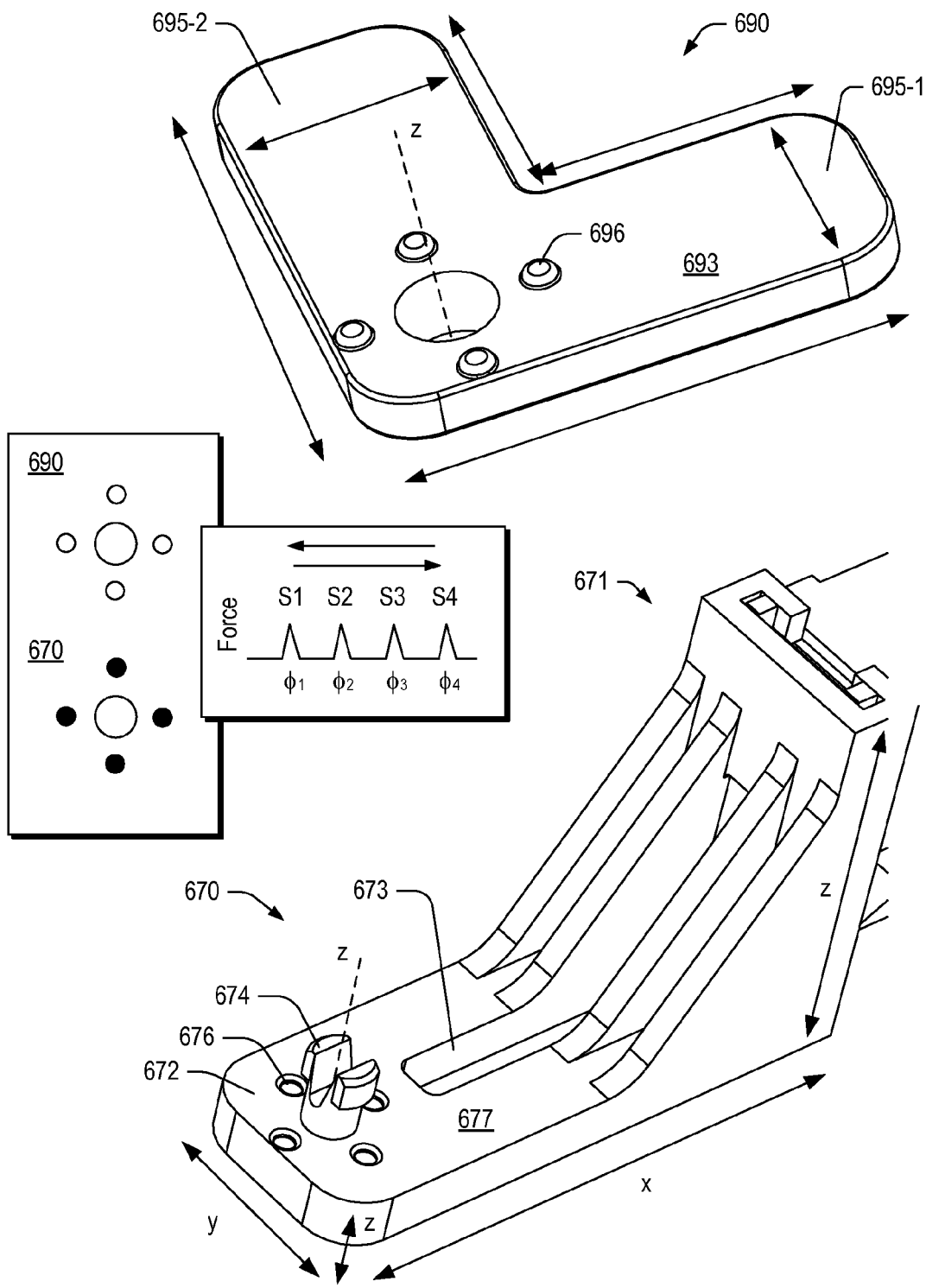
FIG. 11 is a diagram of an example of a portion of an assembly.

FIG. 11 shows the tongue 672 of the card lock 670 and the latch 690 as including cooperating features such as, for example, recesses 676 and protrusions 696 where the protrusions 696 can be at least in part received in respective recesses 676. As an example, the recesses 676 and protrusions 696 can aid in positioning in locked and/or unlocked states (see, e.g., the states of FIG. 4).

In the example of FIG. 11, four recesses 676 cooperate with four protrusions 696 such that they may engage at approximately 90 degree intervals as the latch 690 is rotated about the axle 674. Such an approach can assist with shipping of an unoccupied card lock such that the latch remains in an open or unlocked state that is ready to receive a prong of a card. For example, upon insertion of a card, movement may occur of various parts of a computing system such as, for example, turning a computing system on one side or another side. Cooperating features can help to ensure that a latch remains in an unlocked state until locking is desired (e.g., after properly positioning a card in an edge connector housing and card lock assembly. The cooperating feature can provide friction force that is not readily overcome by gravity, an inadvertent light finger brush, an inadvertent light brush by a cable, etc. A deliberate application of force in a desired direction can be applied to rotate a latch from an unlocked state to a locked state (e.g., and vice versa). Such force can overcome frictional force and may include some amount of bending (e.g., resiliency) as to a latch feature with respect to a tongue feature.

FIG. 11 shows a diagram of the latch 690 and the card lock 670 as including features that can interact to position the latch 690 with respect to the card lock 670. The diagram also shows an axis or axle about which the latch 690 can rotate with respect to the card lock 670. As an example, where a latch can rotate freely in about 360 degrees, movement of a computing system may cause the latch to rotate in an manner by which the latch may transition from a locked state to an unlocked state, an unlocked state to a locked state, from a state to an intermediate position, from an intermediate position to a state, from an intermediate position to another intermediate position, etc. In the example of FIG. 11, frictional force can help to retain the latch 690 in a desired rotational position with respect to the card lock 670 where the latch 690 can be rotatable at least approximately 270 degrees. As an example, the latch 690 may be rotatable at least approximately 360 degrees. As an example, the latch 690 may be rotatable clockwise and/or counter-clockwise in a number of 360 degree rotations. As an example, features can engage at various degrees of rotations where engagement defines a state (e.g., a locked state or an unlocked state).

FIG. 11 shows an example plot of force versus angle where force to rotate a latch increases at particular angles that correspond to states. While force is mentioned, this may be torque, moment, or moment of force, for example, as related to the tendency of a force to rotate an object about an axis, fulcrum, or pivot. Torque can be defined as the cross product of a lever-arm distance vector and a force vector, which tends to produce rotation. In the plot of FIG. 11, arrows indicate directions of rotation. For example, a latch can be a bi-directional latch, rotatable clockwise and counter-clockwise with respect to a rotational axis. As indicated by the plot in FIG. 11, force to rotate may increase during transition to a state and force to rotate may decrease during transition from a state. For example, applied torque can increase to position the latch 690 in a state and an amount of torque may be applied to transition the latch 690 out of that state. In such an example, the amount of torque can be associated with dimensions of features and, for example, resiliency of material of a latch (e.g., to deform a latch, etc.). As an example, the more a protrusion is received by a recess, the torque may increase. As an example, a force or torque plot may depend on the shape of a protrusion or protrusions and the shape of a recess or recesses.

As an example, a system can include a board that includes a chipset that includes a processor; an edge connector housing and card lock assembly mounted to the board where the edge connector housing and card lock assembly includes a tongue that includes an axle and a latch rotatable about the axle for orientation in a locked state and in an unlocked state; and a video card operatively coupled to the processor where the video card includes a graphics processor and an edge received by the edge connector housing and card lock assembly and where the video card includes a prong where, in the locked state, an extension of the latch is disposed between a surface of the prong and a surface of the tongue. In such an example, the latch can be rotatable at least approximately 270 degrees about the axle where, for example, in the locked state, features of the latch and features of the tongue cooperate. For example, the features of the latch and the features of the tongue can include protrusions and recesses that cooperate by seating of the protrusions in the recesses. As an example, a latch can be rotatable at least approximately 360 degrees about an axle and may be rotatable a number of rotations where such a number is greater than 1 (e.g., greater than 360 degrees). As an example, where a latch can rotate at least about 270 degrees, features of the latch and features of a tongue may cooperate in various states (e.g., locked and/or unlocked states; in at least locked states; etc.). As an example, where a latch can rotate at least about 360 degrees, features of the latch and features of a tongue may cooperate in various states (e.g., locked and/or unlocked states; in at least locked states; etc.).

As an example, an edge connector housing and card lock assembly can include a housing width, a video card can include a card width and the card width can exceed the housing width. As an example, a video card can be a computing module card that includes at least one graphics processor (e.g., a multi-core GPU, etc.).

As an example, a latch can be rotatable about an axle for orientation in one of two locked states and can be rotatable about the axle for orientation in one of two unlocked states.

As an example, a system can include a plurality of edge connector housing and card lock assemblies mounted to a board and a plurality of video cards operatively coupled to a processor of a chip set mounted to the board where, for example, each of the video cards can include one or more graphics processors and an edge received by a respective one of the edge connector housing and card lock assemblies.

As an example, a video card can include a PCI Express bus interface (PCIe bus interface).

As an example, a video card can include memory operatively coupled to one or more graphics processors. As an example, a graphics processor can include a plurality of processing cores.

As an example, a system can include at least one display. In such an example, a cable may operatively couple a display to a connector of a video card, which can be a double-wide (e.g., dual slot) video card. As an example, such a video card may include a plurality of connectors to operatively couple the video card to a plurality of displays. As an example, a video card can include wireless display technology, for example, to operatively couple a video card to a display that includes circuitry for wireless communication (e.g., consider INTEL® WiDi technology of Intel Corporation, Santa Clara, Calif.).

As an example, a system can include a plurality of the edge connector housing and card lock assemblies mounted to a board substantially parallel to each other. For example, a board can include features such as openings that locate such assemblies where upon connection of such assemblies to the board, the assemblies include long axes that are substantially parallel to each other (e.g., plus or minus a few degrees such that long boards do not contact when received by such assemblies).

As an example, a system can include a plurality of edge connector housing and card lock assemblies where at least two of the edge connector housing and card lock assemblies are in different states as to two unlocked states and two locked states.

As an example, a system can include a case where the case includes slots and where correspondence exists between a number of edge connector housing and card lock assemblies and a number of the slots. As an example, a video card can include an end that occupies two slots (see, e.g., FIGS. 2, 3 and 5).

As an example, a line of sight can exists for a top view as to a portion of a latch. For example, consider a view of the system 300 or the system 301 of FIG. 5 where an extension of a latch is visible when looking down (e.g., or sideways) toward a board from a viewpoint (e.g., or binocular viewpoints) that are normal to a plane defined by the board. In such an example, where a double-wide video card is received by an edge connector housing and card lock assembly, a user may visibly determine whether the double-wide video card is in a locked or unlocked state (e.g., or possibly in an intermediate state). Further, an extension of a latch may be accessible via a finger of a user to apply force (e.g., torque) to rotate the latch by contacting the extension and overcoming any frictional force (e.g., possibly with some amount of elastic deformation) to rotate the latch to a desired state.

As an example, a latch may be elastically deformable such that features such as, for example, protrusions of the latch can move into and out of recesses of a tongue. As an example, a tongue may include protrusions and a latch may include recesses. As an example, a tongue may include one or more protrusions and one or more recesses and a latch may include one or more protrusions and one or more recesses. As an example, a latch may be operatively coupled to a tongue with some amount of axial play about an axle. In such an example, transitioning from one state to another state may involve movement of the latch axially as well as some amount of elastic deformation of the latch. As an example, an axle may include a spring or other biasing mechanism that causes a latch surface to contact a tongue surface to thereby increase friction. In such an example, a snapping into a state may occur. For example, as protrusions align with recesses, a biasing mechanism may cause the protrusions to snap into the recesses.

As to elastic deformation of an object, once a deformation force is no longer applied, the object can return to its former shape. As an example, a component may be made of an elastomeric material. As an example, a latch may be made of an elastomeric material.

As an example, a latch can include two extensions. In such an example, the extensions can be in a substantially common plane. Such a plane may be relatively flat when features of a latch and of a tongue cooperate (e.g., via seating). As an example, two extensions may define an angle where, for example, the angle is greater than approximately 45 degrees and less than approximately 135 degrees. As an example, the angle may be approximately 90 degrees. As an example, a latch can include two extensions that form an L-shape.

As an example, a latch may be asymmetric in that one side includes features (e.g., one or more protrusions and/or one or more recesses) and another side is relatively flat. In such an example, the "feature" side may be facing outward, away from a board while the relatively flat side (e.g., a relatively smooth side) may be facing inward, toward a board. In such an example, the relatively flat side can move to contact a surface of a prong of a video card to thereby secure the video card in a locked state (see, e.g., FIG. 8).

As an example, a latch can include at least one color coded surface associated with at least one of the states. As an example, a "feature" side may be colored with one or more colors.

As an example, a tongue may include an axle. In such an example, the axle may be integral to the tongue. As an example, an axle may be elastically deformable to receive a component. For example, consider the axle of FIG. 11 where a portion of the axle is stepped and split and defines a larger radius than another portion, which is substantially cylindrical. As an example, a latch can include an opening that is pressed over such an axle where pressing forces the split portions together such that the opening can be positioned axially. In such an example, the split portions may emerge and expand outwardly to secure the latch on the axle.

Various coordinate systems are shown in the drawings. Dimensions, shapes, sizes, ratios, orientations, etc., may be defined with respect to one or more dimensions of one or more coordinate systems.

As described herein, various acts, steps, etc., may be implemented as instructions stored in one or more computer-readable storage media where a computer-readable storage medium is not a signal. For example, one or more computer-readable storage media can include computer-executable (e.g., processor-executable) instructions to instruct a device. A computer-readable medium may be a computer-readable medium that is not a carrier wave.

The term "circuit" or "circuitry" is used in the summary, description, and/or claims. As is well known in the art, the term "circuitry" includes all levels of available integration, e.g., from discrete logic circuits to the highest level of circuit integration such as VLSI, and includes programmable logic components programmed to perform the functions of an embodiment as well as general-purpose or special-purpose processors programmed with instructions to perform those functions. Such circuitry may optionally rely on one or more computer-readable media that includes computer-executable instructions. As described herein, a computer-readable medium may be a storage device (e.g., a memory chip, a memory card, a storage disk, etc.) and referred to as a computer-readable storage medium.

Figure 12:
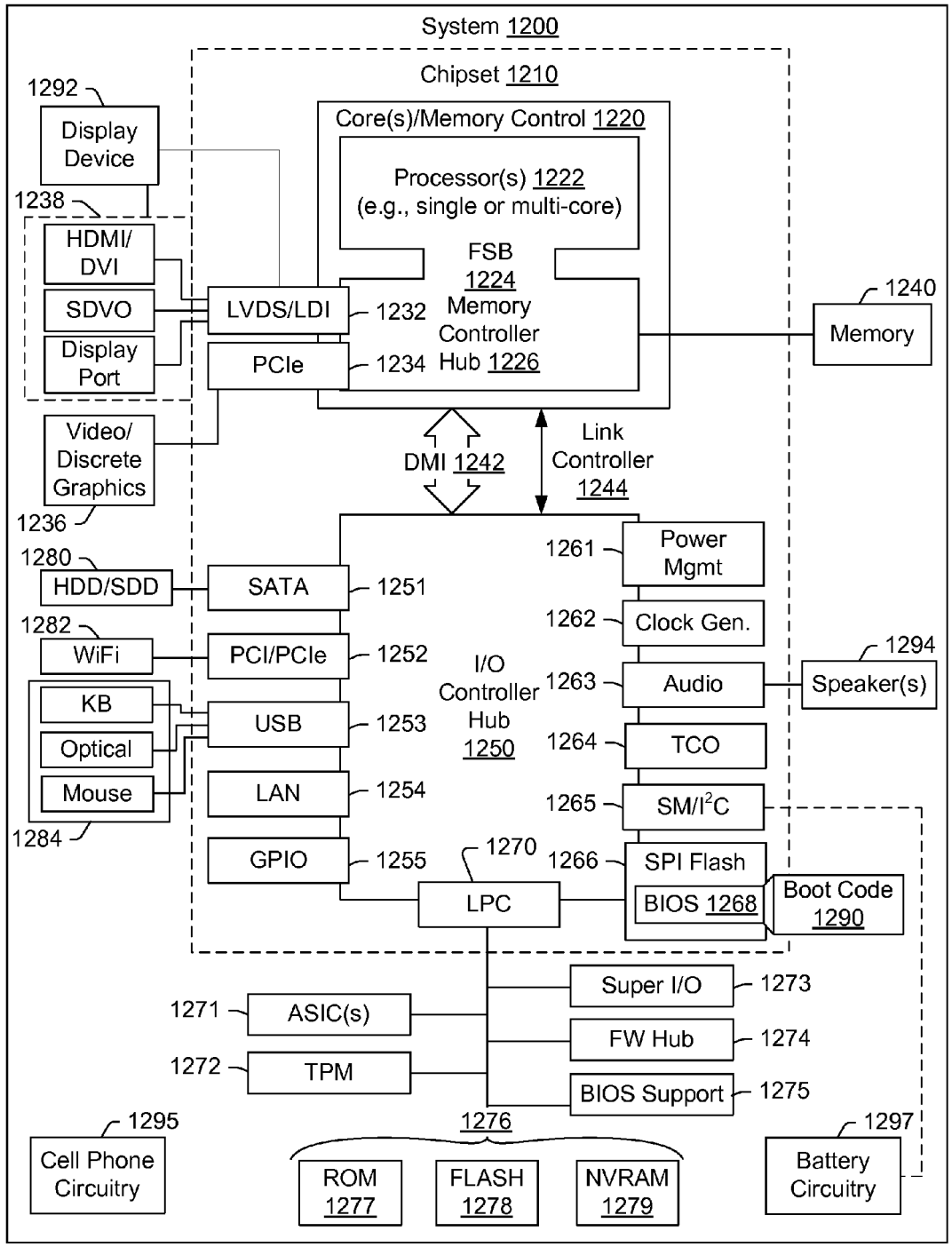
FIG. 12 is a diagram of an example of a system.

While various examples of circuits or circuitry have been discussed, FIG. 12 depicts a block diagram of an illustrative computer system 1200. The system 1200 may be a desktop computer system, such as one of the ThinkCentre® or ThinkPad® series of personal computers sold by Lenovo (US) Inc. of Morrisville, N.C., or a workstation computer, such as the ThinkStation®, which are sold by Lenovo (US) Inc. of Morrisville, N.C.; however, as apparent from the description herein, a satellite, a base, a server or other machine may include other features or only some of the features of the system 1200. As an example, a computing system as shown in the examples of FIGS. 1, 2 and 3 may include at least some of the features of the system 1200.

As shown in FIG. 12, the system 1200 includes a so-called chipset 1210. A chipset refers to a group of integrated circuits, or chips, that are designed (e.g., configured) to work together. Chipsets are usually marketed as a single product (e.g., consider chipsets marketed under the brands INTEL®, AMD®, etc.).

In the example of FIG. 12, the chipset 1210 has a particular architecture, which may vary to some extent depending on brand or manufacturer. The architecture of the chipset 1210 includes a core and memory control group 1220 and an I/O controller hub 1250 that exchange information (e.g., data, signals, commands, etc.) via, for example, a direct management interface or direct media interface (DMI) 1242 or a link controller 1244. In the example of FIG. 12, the DMI 1242 is a chip-to-chip interface (sometimes referred to as being a link between a "northbridge" and a "southbridge").

The core and memory control group 1220 include one or more processors 1222 (e.g., single core or multi-core) and a memory controller hub 1226 that exchange information via a front side bus (FSB) 1224. As described herein, various components of the core and memory control group 1220 may be integrated onto a single processor die, for example, to make a chip that supplants the conventional "northbridge" style architecture.

The memory controller hub 1226 interfaces with memory 1240. For example, the memory controller hub 1226 may provide support for DDR SDRAM memory (e.g., DDR, DDR2, DDR3, etc.). In general, the memory 1240 is a type of random-access memory (RAM). It is often referred to as "system memory".

The memory controller hub 1226 further includes a low-voltage differential signaling interface (LVDS) 1232. The LVDS 1232 may be a so-called LVDS Display Interface (LDI) for support of a display device 1292 (e.g., a CRT, a flat panel, a projector, etc.). A block 1238 includes some examples of technologies that may be supported via the LVDS interface 1232 (e.g., serial digital video, HDMI/DVI, display port). The memory controller hub 1226 also includes one or more PCI-express interfaces (PCIe) 1234, for example, for support of discrete graphics 1236. Discrete graphics using a PCIe interface can be an alternative approach to an accelerated graphics port (AGP). For example, the memory controller hub 1226 may include a 16-lane (×16) PCIe port for an external PCIe-based video card (e.g., video/graphics card). As an example, more than one video card may be utilized. A system may include AGP or PCIe for support of graphics. As an example, a display may be a sensor display (e.g., configured for receipt of input using a stylus, a finger, etc.). As an example, a sensor display may rely on resistive sensing, optical sensing, or other type of sensing.

The I/O hub controller 1250 includes a variety of interfaces. The example of FIG. 12 includes a SATA interface 1251, one or more PCIe interfaces 1252 (optionally one or more legacy PCI interfaces), one or more USB interfaces 1253, a LAN interface 1254 (more generally a network interface), a general purpose I/O interface (GPIO) 1255, a low-pin count (LPC) interface 1270, a power management interface 1261, a clock generator interface 1262, an audio interface 1263 (e.g., for speakers 1294), a total cost of operation (TCO) interface 1264, a system management bus interface (e.g., a multi-master serial computer bus interface) 1265, and a serial peripheral flash memory/controller interface (SPI Flash) 1266, which, in the example of FIG. 12, includes BIOS 1268 and boot code 1290. With respect to network connections, the I/O hub controller 1250 may include integrated gigabit Ethernet controller lines multiplexed with a PCIe interface port. Other network features may operate independent of a PCIe interface.

The interfaces of the I/O hub controller 1250 provide for communication with various devices, networks, etc. For example, the SATA interface 1251 provides for reading, writing or reading and writing information on one or more drives 1280 such as HDDs, SDDs or a combination thereof. The I/O hub controller 1250 may also include an advanced host controller interface (AHCI) to support one or more drives 1280. The PCIe interface 1252 allows for wireless connections 1282 to devices, networks, etc. The USB interface 1253 provides for input devices 1284 such as keyboards (KB), one or more optical sensors, mice and various other devices (e.g., microphones, cameras, phones, storage, media players, etc.). One or more other types of sensors may optionally rely on the USB interface 1253 or another interface (e.g., I²C, etc.). As to microphones, the system 1200 of FIG. 12 may include hardware (e.g., audio card) appropriately configured for receipt of sound (e.g., user voice, ambient sound, etc.).

In the example of FIG. 12, the LPC interface 1270 provides for use of one or more ASICs 1271, a trusted platform module (TPM) 1272, a super I/O 1273, a firmware hub 1274, BIOS support 1275 as well as various types of memory 1276 such as ROM 1277, Flash 1278, and non-volatile RAM (NVRAM) 1279. With respect to the TPM 1272, this module may be in the form of a chip that can be used to authenticate software and hardware devices. For example, a TPM may be capable of performing platform authentication and may be used to verify that a system seeking access is the expected system.

The system 1200, upon power on, may be configured to execute boot code 1290 for the BIOS 1268, as stored within the SPI Flash 1266, and thereafter processes data under the control of one or more operating systems and application software (e.g., stored in system memory 1240). An operating system may be stored in any of a variety of locations and accessed, for example, according to instructions of the BIOS 1268. Again, as described herein, a satellite, a base, a server or other machine may include fewer or more features than shown in the system 1200 of FIG. 12. Further, the system 1200 of FIG. 12 is shown as optionally include cell phone circuitry 1295, which may include GSM, CDMA, etc., types of circuitry configured for coordinated operation with one or more of the other features of the system 1200. Also shown in FIG. 12 is battery circuitry 1297, which may provide one or more battery, power, etc., associated features (e.g., optionally to instruct one or more other components of the system 1200). As an example, a SMBus may be operable via a LPC (see, e.g., the LPC interface 1270), via an I²C interface (see, e.g., the SM/I²C interface 1265), etc.

Although examples of methods, devices, systems, etc., have been described in language specific to structural features and/or methodological acts, it is to be understood that the subject matter defined in the appended claims is not necessarily limited to the specific features or acts described. Rather, the specific features and acts are disclosed as examples of forms of implementing the claimed methods, devices, systems, etc.

What is claimed is:

1. A system comprising:
    a board that comprises a chipset that comprises a processor;
    an edge connector housing and card lock assembly mounted to the board wherein the edge connector housing and card lock assembly comprises a housing width and a tongue that comprises an axle and a latch rotatable at least approximately 270 degrees about the axle for orientation in a locked state and in an unlocked state, wherein, in the locked state, features of the latch and features of the tongue cooperate; and
    a video card operatively coupled to the processor wherein the video card comprises a card width that exceeds the housing width, a graphics processor and an edge received by the edge connector housing and card lock assembly and wherein the video card comprises a prong wherein, in the locked state, an extension of the latch is disposed between a surface of the prong and a surface of the tongue.

2. The system of claim 1 wherein the features of the latch and the features of the tongue comprise protrusions and recesses that cooperate by seating of the protrusions in the recesses.

3. The system of claim 1 wherein the latch is rotatable about the axle for orientation in one of two locked states and wherein the latch is rotatable about the axle for orientation in one of two unlocked states.

4. The system of claim 1 comprising another one of the edge connector housing and card lock assemblies mounted to the board and another video card operatively coupled to the processor wherein the another video card comprises a graphics processor and an edge received by the another edge connector housing and card lock assembly.

5. The system of claim 1 wherein the video card comprises a PCI Express bus interface.

6. The system of claim 1 wherein the video card comprises memory operatively coupled to the graphics processor.

7. The system of claim 1 wherein the graphics processor comprises a plurality of processing cores.

8. The system of claim 1 further comprising at least one display.

9. The system of claim 1 comprising a plurality of the edge connector housing and card lock assemblies mounted to the board substantially parallel to each other.

10. The system of claim 9 wherein at least two of the edge connector housing and card lock assemblies are in different states as to two unlocked states and two locked states.

11. The system of claim 9 comprising a case wherein the case comprises slots and wherein correspondence exists between a number of the edge connector housing and card lock assemblies and a number of the slots.

12. The system of claim 11 wherein the video card comprises an end that occupies two of the slots.

13. The system of claim 1 wherein a line of sight exists for a top view as to a portion of the latch.

14. The system of claim 1 wherein the latch comprises two extensions.

15. The system of claim 14 wherein the two extensions define an angle wherein the angle is greater than approximately 45 degrees and less than approximately 135 degrees.

16. The system of claim 1 wherein the latch comprises two extensions that form an L-shape.

17. The system of claim 1 wherein the latch comprises at least one color coded surface associated with at least one of the states.

* * * * *